(12) United States Patent
Copner et al.

(10) Patent No.: US 8,929,409 B2
(45) Date of Patent: Jan. 6, 2015

(54) EXTERNAL CAVITY TUNABLE LASER WITH AN AIR GAP ETALON COMPRISING WEDGES

(75) Inventors: Nigel Copner, Swansea (GB); Nayla El Dahdah, Swansea (GB)

(73) Assignee: Renishaw PLC, Wotton-under-Edge (GB)

( * ) Notice: Subject to any disclaimer, the term of this patent is extended or adjusted under 35 U.S.C. 154(b) by 0 days.

(21) Appl. No.: 12/747,674

(22) PCT Filed: Dec. 22, 2008

(86) PCT No.: PCT/GB2008/004253
§ 371 (c)(1),
(2), (4) Date: Jun. 17, 2010

(87) PCT Pub. No.: WO2009/081160
PCT Pub. Date: Jul. 2, 2009

(65) Prior Publication Data
US 2010/0265973 A1    Oct. 21, 2010

(30) Foreign Application Priority Data
Dec. 20, 2007 (GB) .................................. 0724874.3

(51) Int. Cl.
*H01S 3/10*     (2006.01)
*G02B 26/00*    (2006.01)
*H01S 3/106*    (2006.01)
*H01S 3/08*     (2006.01)
*H01S 5/14*     (2006.01)

(52) U.S. Cl.
CPC ............ *H01S 3/1062* (2013.01); *G02B 26/001* (2013.01); *H01S 3/08036* (2013.01); *H01S 5/141* (2013.01)
USPC ................... 372/20; 372/14; 372/15; 372/16

(58) Field of Classification Search
CPC ..... G02B 26/001; H01S 3/1062; H01S 5/141; H01S 3/08036
USPC .......................................... 372/14, 15, 16, 20
See application file for complete search history.

(56) References Cited

U.S. PATENT DOCUMENTS 5,243,614 A * 9/1993 Wakata et al. ........... 372/29.021
5,862,162 A    1/1999 Maeda
(Continued)

FOREIGN PATENT DOCUMENTS

CN         151163 A      7/2004
EP     0 924 821 A1     6/1999
(Continued)

OTHER PUBLICATIONS

Office Action issued in European Application No. 08 865 429.8 dated Nov. 10, 2010.
(Continued)

*Primary Examiner* — Yuanda Zhang
(74) *Attorney, Agent, or Firm* — Oliff PLC

(57) ABSTRACT

A tunable narrow linewidth laser is provided, wherein an adjustable etalon structure is employed to simultaneously tune the wavelength of the laser transmission and the length of the laser cavity. The etalon structure is an effective, relatively thick shear plate comprised of transparent matched wedge-shaped substrates and a pair of parallel, partially transmissive mirrors with a space therebetween. Rotation of the etalon structure relative to the laser input changes the angle of incidence to the first substrate and the etalon angle, thereby changing the wavelength of the laser light and also changing the length of the external laser cavity. Thus, reliable frequency tuning is achieved, without mode hopping.

26 Claims, 5 Drawing Sheets

(56) References Cited

U.S. PATENT DOCUMENTS

| | | | |
|---|---|---|---|
| 6,049,554 A | 4/2000 | Lang et al. | |
| 6,252,897 B1 | 6/2001 | Abe | |
| 6,940,879 B2 | 9/2005 | Zhang | |
| 6,967,976 B2 | 11/2005 | Xie et al. | |
| 7,099,358 B1 | 8/2006 | Chong | |
| 2002/0136104 A1* | 9/2002 | Daiber | 369/44.23 |
| 2004/0109487 A1 | 6/2004 | Zhang | |
| 2005/0008045 A1 | 1/2005 | Xie et al. | |
| 2005/0078906 A1* | 4/2005 | Lunt et al. | 385/15 |
| 2005/0105565 A1 | 5/2005 | Tobiason et al. | |
| 2006/0109872 A1 | 5/2006 | Sanders | |
| 2006/0109873 A1 | 5/2006 | Crosson et al. | |
| 2006/0203859 A1 | 9/2006 | Cable et al. | |

FOREIGN PATENT DOCUMENTS

| | | |
|---|---|---|
| EP | 1 220 389 A1 | 7/2002 |
| JP | A-01-233785 | 9/1989 |
| JP | U-07-043243 | 8/1995 |
| JP | A-10-133243 | 5/1998 |
| JP | A-11-293202 | 10/1999 |
| JP | A-2002-164614 | 6/2002 |
| JP | A-2006-24876 | 1/2006 |
| JP | A-2006-024876 | 1/2006 |
| JP | A-2006-080384 | 3/2006 |
| JP | A-2007-027306 | 1/2007 |
| JP | A-2008-071798 | 3/2008 |
| JP | A-2008-71798 | 3/2008 |
| WO | WO 01/73905 A1 | 10/2001 |
| WO | WO 2006/079100 A2 | 7/2006 |
| WO | WO 2009/081160 A1 | 7/2009 |

OTHER PUBLICATIONS

Jul. 26, 2011 Office Action issued in Chinese Patent Application No. 200880120808.6 (with partial translation).

Aug. 22, 2012 Office Action issued in Chinese Patent Application No. 200980150913.9 w/translation.

Jul. 19, 2013 Office Action issued in U.S. Appl. No. 13/132,182.

International Patent Application No. PCT/GB2009/002880, Dec. 16, 2009.

International Search Report issued on Mar. 24, 2010 in International Patent Application No. PCT/GB2009/002880.

D. Ko et al. "Accurate frequency-tuning mechanism from a wedge prism in a single-mode tunable laser," *Applied Optics*, vol. 34, No. 6, Feb. 20, 1995, Washington, D.C., USA.

International Search Report issued on May 29, 2009 in International Patent Application No. PCT/GB2008/004253.

Written Opinion of the International Searching Authority issued on May 29, 2009 in International Patent Application No. PCT/GB2008/004253.

Jun. 24, 2013 Office Action issued in Chinese Patent Application No. 200980150913.9 w/translation.

Jan. 8, 2014 Office Action issued in U.S. Appl. No. 13/132,182.

Do-Kyeong et al., *Accurate frequency-tuning machanism from a wedge prism in a single-mode tunable laser*, Applied Optics, Feb. 20, 1995, vol. 34 No.6, pp. 983-987.

Feb. 12, 2014 Official Notice of Rejection issued in Japanese Patent Application No. 2011-541579 (with translation).

Aug. 29, 2014 Office Action issued in U.S. Appl. No. 13/132,182.

\* cited by examiner

EXTERNAL CAVITY TUNABLE LASER WITH AN AIR GAP ETALON COMPRISING WEDGES

A tunable laser is a laser whose wavelength of operation can be altered in a controlled manner. While all laser gain media allow small shifts in output wavelength, only a few types of lasers allow continuous tuning over a significant wavelength range.

There are many types and categories of tunable lasers, and one known type of laser tenability is known as single line tuning. Since no real laser is truly monochromatic, all lasers can emit light over some range of frequencies, known as the linewidth of the laser transition. In most lasers, this linewidth is quite narrow (for example, the 1064 nm wavelength transition of a Nd:YAG laser has a linewidth of approximately 120 GHz, corresponding to a 0.45 nm wavelength range). Tuning of the laser output across this range can be achieved by placing wavelength-selective optical elements into the laser's optical cavity, to provide selection of a particular longitudinal mode of the cavity.

One such wavelength-selective optical element is an etalon which comprises two substantially parallel, partially transmitting mirrors. Transmission through an etalon is generally low except for a series of peaks, which are approximately equally spaced at an interval known as the free spectral range (FSR) of the etalon. The centre wavelength of an etalon transmission peak can be varied by changing the optical distance between the etalon mirrors. It is necessary for the etalon FSR to be substantially larger than the desired tuning range of the laser, to ensure that only one of the etalon transmission peaks is within the desired tuning range. The bandwidth of the transmission peaks is also an important parameter for laser tuning, since bandwidth determines the loss seen by the modes adjacent to the lasing mode, which in turn determines the side mode suppression ratio (SMSR). Both the bandwidth and free spectral range of an etalon can be varied according to known design principles.

US Patent Application Publication No. US2005/0008045 A1 describes a tunable laser in which a tunable etalon is used as a mirror within an external semiconductor cavity. The etalon, which is used to tune the said cavity, is tunable by microelectromechanical means for controlling the optical space between the two parallel mirrors. However, this has the effect of tuning only the wavelength of the laser emission, which can result in mode hopping. By way of brief explanation, a laser cavity can only support certain modes of oscillation, which modes can be longitudinal and transverse. Mode hopping is simply the laser jumping between possible modes, and for longitudinal mode hopping the laser wavelength is effectively jumping. Mode hopping is undesirable in many applications since it introduces unwanted intensity noise.

We have now devised an improved tunable laser, in which at least some of the problems associated with known systems are alleviated.

In accordance with the present invention, there is provided a laser system comprising a laser source, a laser cavity and a wavelength discriminating structure for receiving an input from said laser source and generating a laser output, said system further comprising means for selectively changing the angle of incidence of said input on said wavelength discriminating structure so as to cause simultaneous corresponding changes in the length of said laser cavity and the frequency of said laser output.

The present invention, therefore, enables reliable tuning of laser emission without mode hopping because the wavelength discriminating structure (possibly a diffraction grating but preferably an etalon structure) is designed such that wavelength and cavity length are tuned simultaneously by selectively changing the angle of incidence of the laser input on said wavelength discriminating structure. First and second etalon mirrors may be provided on respective first and second substrates, which are then beneficially arranged and configured such that adjustment of said etalon structure relative to said laser source (preferably rotation of said etalon structure relative to said laser source about an axis which is transverse relative to the optical path of the laser system) causes a corresponding change in the angle of incidence of said laser input thereon, and more preferably, the first and second substrates and said respective first and second mirrors are configured to act as an effective, substantially shear plate.

In one preferred embodiment, said first substrate has an input surface and said second substrate has an output surface, said input and output surfaces being substantially parallel to each other and non-parallel to said first and second mirror. For example, said first and second substrates may comprise matched transmissive wedges.

The space between said first and second mirrors preferably comprises a hermetically sealed air gap, such that the structure is temperature insensitive.

The system preferably further comprises a filter for limiting the spectrum of said input from said laser source to a predetermined tuning range, which predetermined tuning range is beneficially substantially equal to the free spectral range (FSR) of said etalon structure.

These and other aspects of the present invention will be apparent from, and elucidated with reference to, the embodiments described herein.

Embodiments of the present invention will now be described by way of examples only and with reference to the accompanying drawings, in which.

A tunable, narrow linewidth laser according to a preferred exemplary embodiment of the present invention is designed to be robust, with a linewidth of less than 500 kHz, frequency chirps over 100 GHz at a 1 kHz repetition rate, and no mode hopping.

Figure 1:
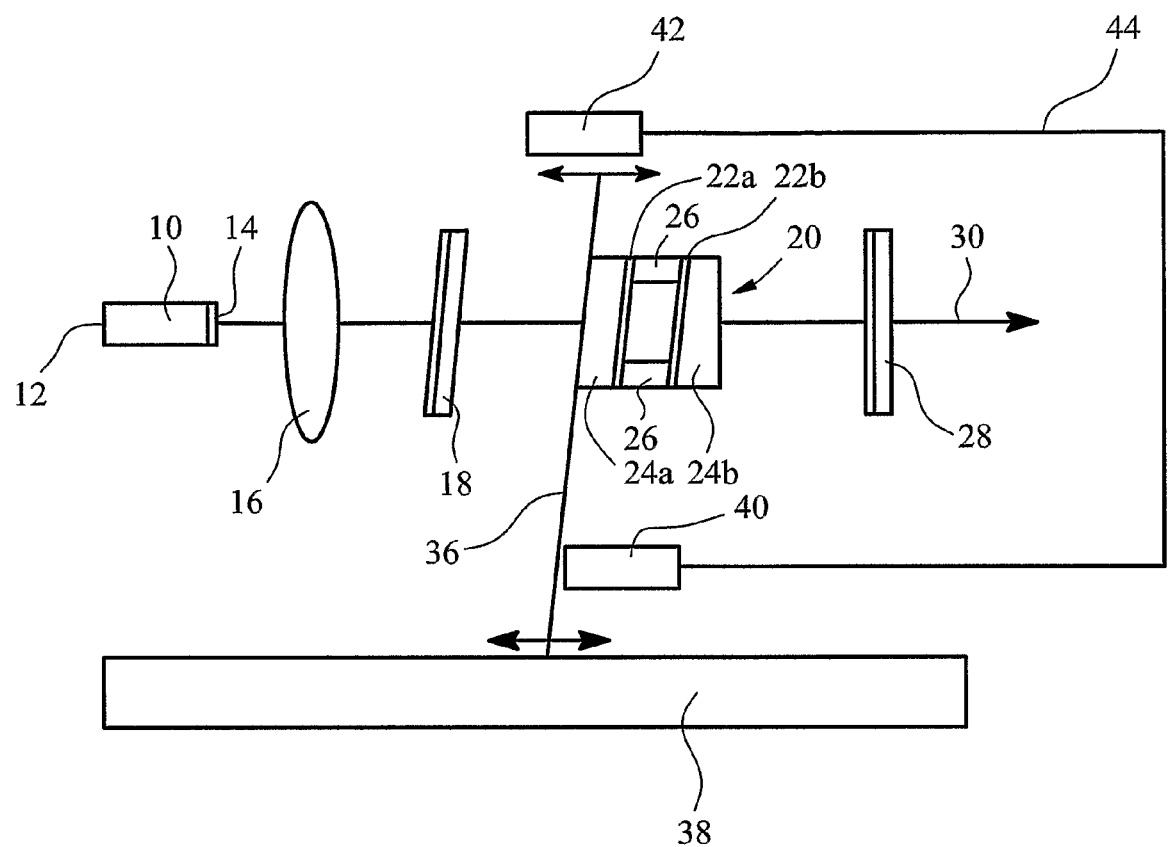
FIG. 1 is a schematic diagram illustrating some of the principle components of a laser system according to an exemplary embodiment of the present invention.

Referring to FIG. 1 of the drawings, a tunable laser according to an exemplary embodiment of the present invention has a pumped gain medium 10 with a high reflectivity (HR) reflector 12 at the laser input facet (e.g. reflectivity R>35%) and an anti-reflective (AR) coating (e.g. R<0.1%) at the opposing laser output facet thereof. The AR coating 14 of the output laser facet allows an effective external cavity to be established without mode competition.

Figure 2:
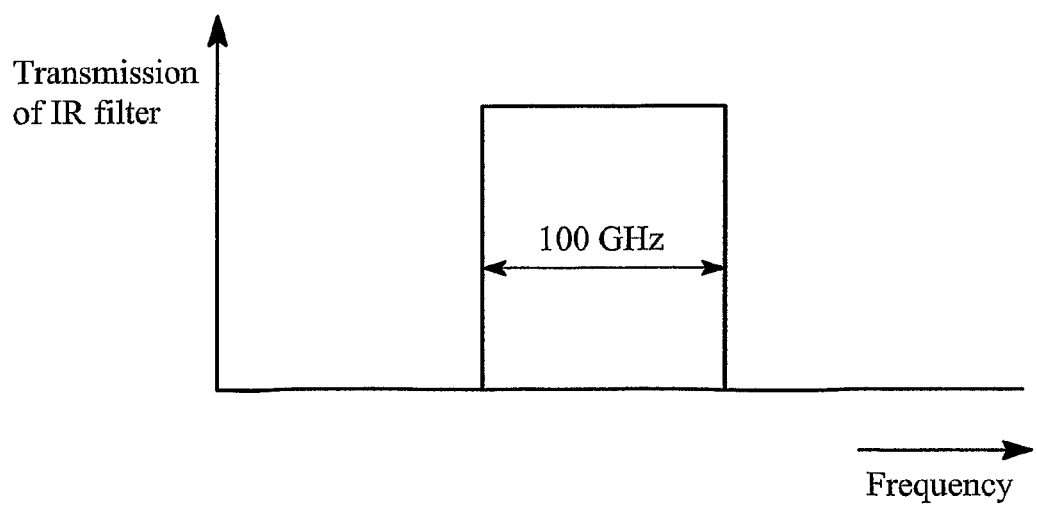
FIG. 2 illustrates schematically the bandpass frequency of the filter provided in the system of FIG. 1.

Laser output from the gain medium 10 passes through a collimating lens 16 to an infrared (IR) filter 18, arranged and configured to limit the optical spectrum to 100 GHz, i.e. the tuning range and FSR of the etalon 20 (as illustrated schematically by FIG. 2). Because the IR filter 18 restricts laser frequency to only a small range of 100 GHz, a 100 GHz FSR etalon will only have one resonant mode within this frequency.

The etalon 20 comprises two parallel, partially transmitting mirrors 22a, 22b provided on respective matched wedge plates 24a, 24b. The optical space between the reflectors 22a, 22b is defined by opposing spacers 26 provided therebetween. Thus, the spacing between the etalon reflectors 22a, 22b is fixed. Laser light output from the etalon 20 passes to a laser output coupler 28 (e.g. R>90%) to provide the desired chirped laser output 30.

Rotation of the etalon reflectors 22a, 22b enables the laser emission wavelength to be tuned through 100 GHz. In this exemplary embodiment of the invention, the etalon substrates are matched wedges 24a, 24b which create an effective, relatively thick shear plate which, when rotated, also change the cavity length due to the fact that the structure allows the angle of incidence (AOI) of the laser transmission to be altered, as will be explained in more detail later. In other words, etalon rotation tunes the laser emission wavelength and the cavity length simultaneously, thereby eliminating mode hopping and enabling reliable tuning of the laser emission through 100 GHz. Considering the illustrated exemplary embodiment, for the etalon to tune through 100 GHz, the effective etalon cavity length will need to change by 100e9/1e14, i.e. 1000 ppm. For elimination of mode hop during tuning, the following expressions must be satisfied:

$$N\lambda/2 = L_{cavity} \quad \text{(Laser condition)}$$

$$m\lambda = 2nd \cos \vartheta \quad \text{(Etalon condition)}$$

When the laser frequency increases by 100 GHz (1000 ppm), the laser cavity will need to decrease in length by 1000 ppm*30 mm, i.e. 30 microns, in order to avoid mode hopping. By the use of an effective shear plate (via the matched wedges 24a, 24b) built into the etalon substrates 22a, 22b, when the etalon is rotated, the laser cavity length will change by the correct amount to allow mode hop free tuning.

Figure 3:
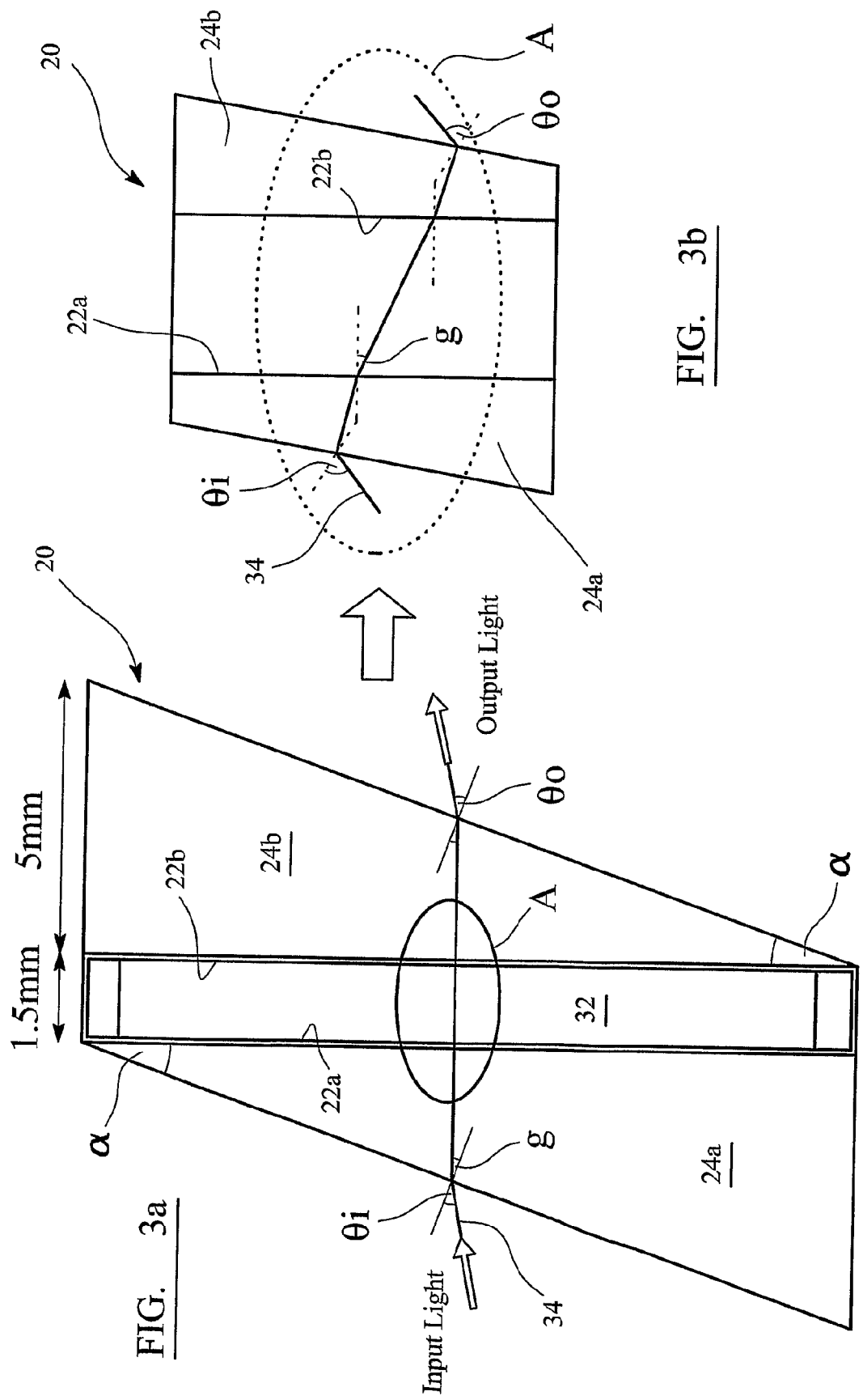
FIGS. 3a and 3b illustrate schematically the etalon structure provided in the system of FIG. 1.
Figure 6:
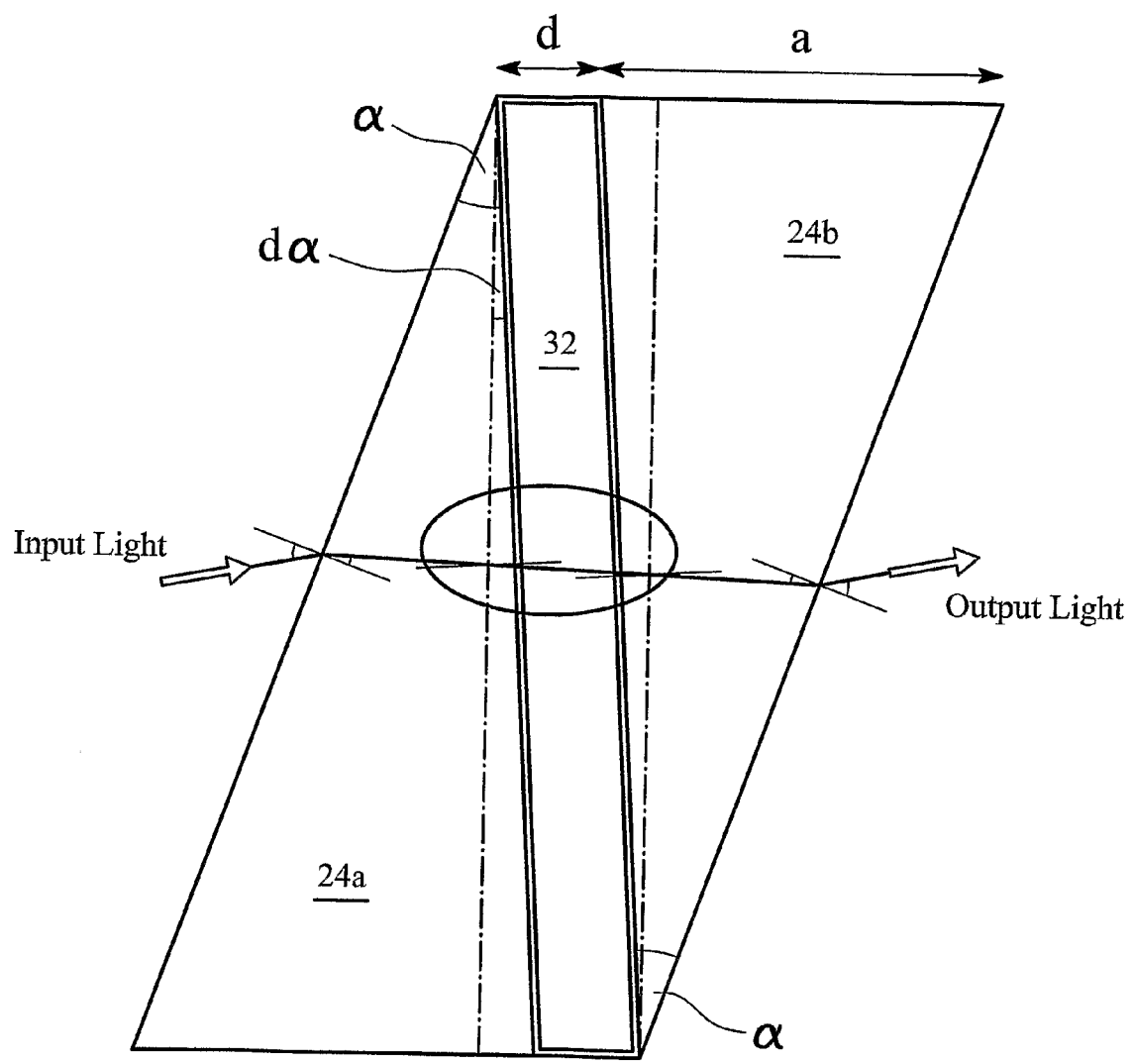
FIGS. 6 and 7 illustrate schematically respective alternative designs of an etalon structure for use in a laser system according to an exemplary embodiment of the present invention.
Figure 7:
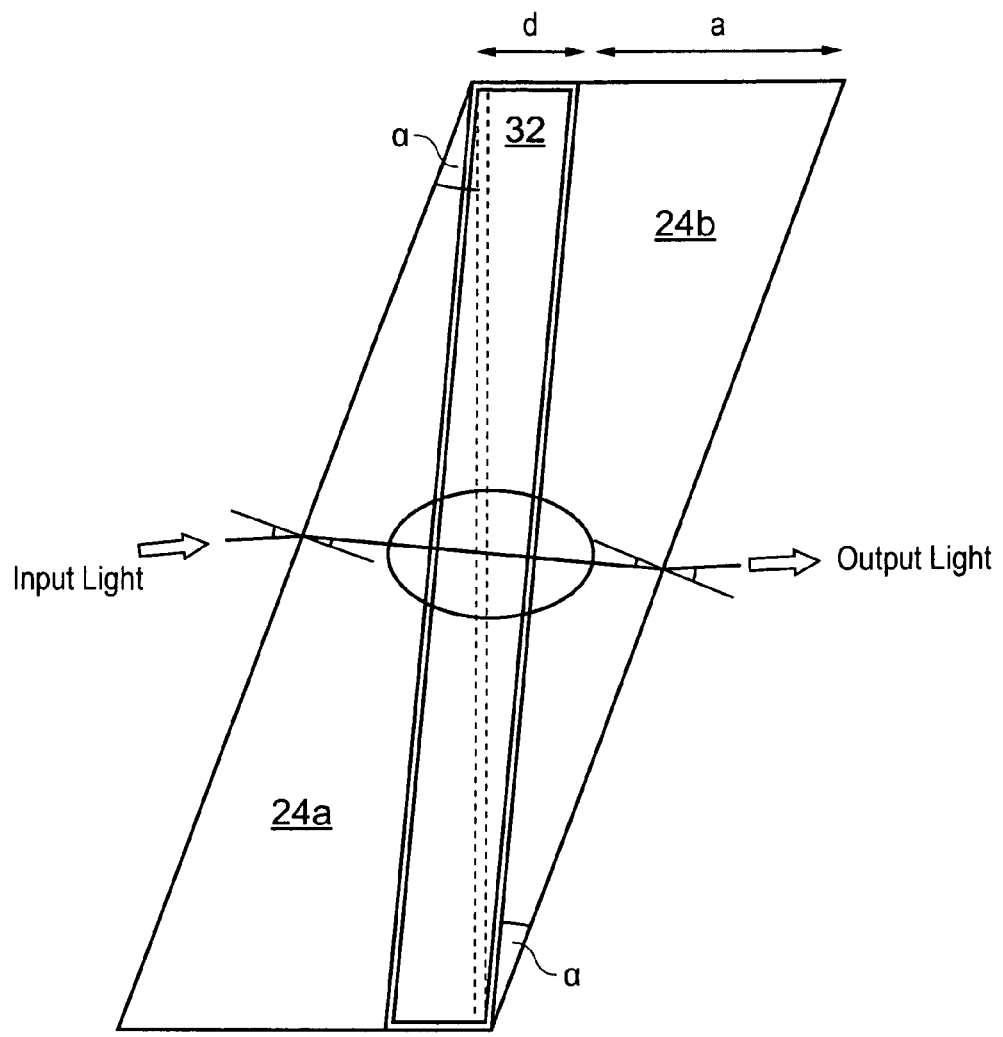

Referring additionally to FIGS. 3a and 3b of the drawings, the etalon structure 20 can be seen in more detail. The illustrated structure 20 comprises two, parallel reflectors 22a, 22b provided on respective matched wedge plates 24a, 24b. The optical space (or airgap 32) between the reflectors 22a, 22b is defined by opposing spacers 26 provided therebetween. For completeness, it is envisaged that the matched wedges 24a, 24b may be formed of fused silica (with an apex angle of, for example, 20 degrees) and the etalon spacers 26 may be formed of ULE (which would maintain temperature insensitivity if made hermetic), for example. However, other suitable materials are envisaged and the present invention is not intended to be limited in this regard. Another consideration arises in the design of the matched wedges 24a, 24b and specifically the apex angle $\alpha$. In the illustrated example, the matched wedges are in the form of right-angled triangles, such that the angle of the etalon relative to the vertical is 0. The present invention is not intended to be limited in this regard, however. Referring to FIGS. 6 and 7 of the drawings, the angle d$\alpha$ may be greater than or less than 0 respectively. However, if the apex angle of the matched wedges is increased, the possible AOI of the input laser transmission increases. Thus, if the apex angle is increased too far, the said AOI may be extended beyond that required for the desired frequency tuning range. Equally, if the apex angle is decreased too far, the etalon angle will be decreased below that required for the desired frequency tuning range. Therefore, there is a design limit on the angle d$\alpha$.

Figure 4:
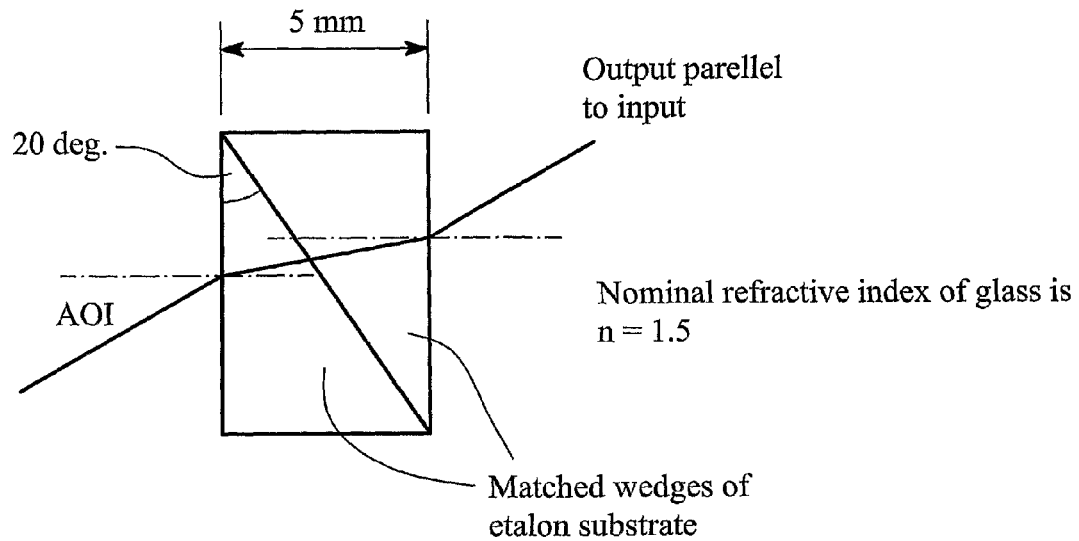
FIGS. 4 and 5 illustrate schematically the principle of changing the optical path of laser transmission by changing the angle of incidence of laser input in respect of a pair of matched wedges such as those used in the etalon structure provided in the system of FIG. 1.

As illustrated, upon rotation of the etalon structure 20, the angle of incidence $\vartheta_i$ of the input light 34 on the effective shear plate formed by the matched wedges 24a, 24b, as well as the angle of incidence $\vartheta$ on the etalon to be changed, which enables optimised path and frequency tracking to avoid mode hops and the need to provide several actuators. In more detail, etalon frequency transmission peaks can be tuned by means of rotation of the etalon structure in accordance with the following statement:

$$\Delta\lambda/\lambda = -\vartheta^2/2n^2$$

where $\lambda$ is the output light frequency, $\Delta\lambda$ is the frequency shift, $\vartheta$ is the etalon angle and n is refractive index of the optical space 32 between the reflectors 22a, 22b which, in this case, is 1. Thus, an etalon angle $\vartheta$ tuned from AOI $\theta_i$ of 0.5 degrees to ~2 degrees at 1550 nm will be frequency shifted by 100 GHz or 0.8 nm. As the etalon is rotated, its resonant wavelength decreases, which requires a shorter cavity length in order to eliminate the possibility of a mode hop. Thus, when the AOI on the substrate changes through $\theta_i$, the etalon angle $\vartheta$ increases, i.e. the resonant wavelength of the etalon decreases, and the AOI on the second substrate 24b decreases, creating an effective reduction in optical path length, as illustrated schematically by FIG. 4.

Figure 5:
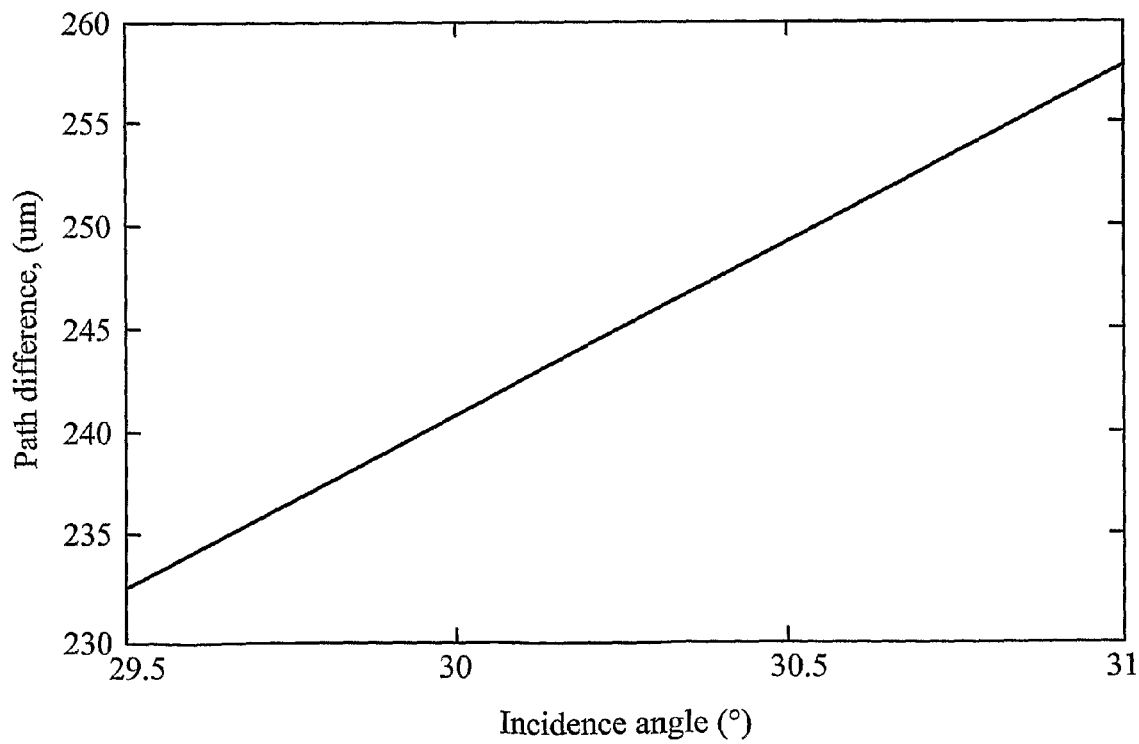

Referring to FIG. 5, in the specific exemplary embodiment of the invention described herein, changing the AOI on the substrate from 31 degrees to 29.5 degrees, the optical path changes by ~30 microns. This same AOI change changes the etalon angle from 0.5 to 1.8 degrees, which equates to ~100 GHz increase in frequency.

With reference to the accuracy of frequency tuning, 1 ppm frequency accuracy (which equates to an etalon displacement resolution of 1.25 nms) requires highly linear tuning, highly reproducible tuning or, more preferably, means for accurately measuring frequency tuning during operation. Referring back to FIG. 1 of the drawings, a proposed actuation mechanism for rotation of the etalon structure comprises a metallic flexure 36 mounted on a solid metallic base 38, the flexure 36 being coupled to the etalon structure and actuated by means of a piezo actuator 40. A measurement sensor 42, optionally in a closed loop connection 44 with the piezo actuator 40, is also provided. Thus, in use, the flexure 36, actuated by the piezo actuator 40, causes rotation of the etalon structure 20 to achieve the desired change of AOI to achieve the desired frequency shift. Possible measuring techniques for monitoring the progress of this operation include monitoring the voltage output of the piezo actuator 40, measuring displacement of the flexure 36 and/or the etalon structure 20 via a linear or rotary encoder or scales, and measuring the rotation of the etalon structure 20 by means of an optical encoder monitoring etalon transmission. One specific option might be to use an ultra-sensitive capacitance meter with a resolution of 20 pm. However, other techniques are envisaged, and the present invention is not intended to be limited in this regard.

It should be noted that the present invention is not restricted to the above-described embodiment and preferred embodiments may vary within the scope of the appended claims. The term "comprising", when used in the specification including the claims, is intended to specify the presence of stated features, means, steps or components, but does not exclude the presence or addition of one or more other features, means, steps, components or groups thereof. Furthermore, the word "a" or "an" preceding an element in a claim does not exclude the presence of a plurality of such elements. Moreover, any reference sign does not limit the scope of the claims. The invention can be implemented by means of both hardware and software, and several "means" may be represented by the same item of hardware. Finally, the features of the invention, which features appear alone or in combination, can also be combined or separated so that a large number of variations and applications of the invention can be readily envisaged.

The invention claimed is:

1. A laser system comprising:
   a laser source;
   a laser cavity;
   an etalon structure for receiving a laser input from said laser source and generating a laser output; and
   the etalon structure comprising first and second substrates on which are respectively provided first and second partially transmissive mirrors which are parallel to each other with a space therebetween, wherein
   said first substrate has an input surface and said second substrate has an output surface, said input surface and said output surface being substantially parallel to each other and non-parallel to said first and second partially transmissive mirrors, and
   said laser system further comprises means for rotating said etalon structure relative to said laser input to selectively change an angle of incidence of said laser input on said input surface to cause simultaneous corresponding changes in a length of said laser cavity and a wavelength of said laser output that provide tuning of the laser output wavelength without mode hopping,
   wherein the changes in length of said laser cavity and wavelength of said laser output that provide tuning of the laser output wavelength without mode hopping are caused only by the rotation of said etalon structure relative to said laser input.

2. The laser system according to claim 1, wherein said means for rotating said etalon structure relative to said laser input comprises optical means, separate from said etalon structure, for selectively altering an optical path of said laser input prior to incidence thereof on said input surface.

3. The laser system according to claim 1, wherein said means for rotating said etalon structure relative to said laser input comprises means for adjusting the etalon structure relative to said laser input.

4. The laser system according to claim 1, wherein said means for rotating said etalon structure relative to said laser input comprises an actuator mechanism for mechanically rotating the etalon structure.

5. The laser system according to claim 1, wherein said first and second substrates are transmissive and said etalon structure is configured to act as an effective substantially shear plate.

6. The laser system according to claim 1, wherein said means for rotating said etalon structure relative to said laser input is arranged to selectively rotate said etalon structure about an axis which is transverse to an optical path of the laser system.

7. The laser system according to claim 1, wherein said first and second substrates comprise matched transmissive wedges.

8. The laser system according to claim 1, wherein said space between said first and second partially transmissive mirrors is filled with a material having a refractive index different than that of said first and second substrates.

9. The laser system according to claim 8, wherein said refractive index of said material in said space is less than that of said first and second substrates.

10. The laser system according to claim 9, wherein said space is filled with air.

11. The laser system according to claim 10, wherein said space is hermetically sealed.

12. The laser system according to claim 1, further comprising a filter for limiting a spectrum of said laser input from said laser source to a predetermined tuning range.

13. The laser system according to claim 12, wherein said predetermined tuning range is substantially equal to a free spectral range (FSR) of said etalon structure.

14. The laser system according to claim 1, further comprising means for monitoring selective changes in said angle of incidence of said laser input on said input surface.

15. The laser system according to claim 14, wherein said monitoring means generates at least one of a signal representative of said angle of incidence of said laser input on said input surface, and/or changes therein, said signal being input to a control means for controlling changes in said angle of incidence.

16. The laser system according to claim 15, wherein said means for rotating said etalon structure relative to said laser input comprises means for adjusting said etalon structure relative to said laser input, and said monitoring means comprises measuring means for measuring said relative adjustment of said etalon structure.

17. The laser system according to claim 4, wherein said actuator mechanism comprises a piezo actuator.

18. The laser system according to claim 17, wherein said actuator mechanism comprises a metallic flexure that couples the etalon structure to a solid metallic base, the metallic flexure being coupled to and actuated by the piezo actuator.

19. The laser system according to claim 1, wherein the space between the first and second partially transmissive mirrors is fixed.

20. The laser system according to claim 1, wherein the space between the first and second partially transmissive mirrors is defined by opposing spacers provided between the first and second partially transmissive mirrors.

21. The laser system according to claim 1, wherein the etalon structure is an integral etalon structure.

22. The laser system according to claim 1, wherein the rotation of the etalon structure relative to the laser input causes simultaneous changes in:
   (a) a tuning wavelength of the etalon structure, and therefore the wavelength of the laser output, due to resulting changes in an angle at which light from the laser input travels through the space between the first and second partially transmissive mirrors of the etalon structure, and
   (b) the laser cavity length, due to resulting changes in an optical path length of light from the laser input through the etalon structure, and
   wherein the first and second substrates of the etalon structure are configured and arranged so that, as the etalon structure rotates relative to the laser input, the changes in the laser cavity length according to (b) are sufficient to prevent hopping between different modes of the laser cavity which would otherwise be caused by the changes in the tuning wavelength of the etalon structure according to (a).

23. The laser system according to claim 22, wherein the first and second substrates of the etalon structure are configured and arranged so that the expressions $N\lambda/2 = L_{cavity}$ and $m\lambda = 2nd \cos\vartheta$ are simultaneously satisfied during the relative rotation of the etalon structure,
   where $\lambda$ represents the tuning wavelength of the etalon structure, $\vartheta$ represents the angle at which light from the laser input travels through the space between the first and second partially transmissive mirrors, d represents the spacing between the first and second partially transmissive mirrors, N and m are integers and n represents the refractive index of material in the space between the first and second partially transmissive mirrors.

24. A laser system comprising:
a laser source;
a laser cavity;
an etalon structure for receiving a laser input from said laser source and generating a laser output; and
the etalon structure comprising first and second substrates on which are respectively provided first and second partially transmissive mirrors which are parallel to each other with a space therebetween, wherein
said first substrate has an input surface and said second substrate has an output surface, said input surface and said output surface being substantially parallel to each other and non-parallel to said first and second partially transmissive mirrors, and
said laser system further comprises a device for rotating said etalon structure relative to said laser input to selectively change an angle of incidence of said laser input on said input surface to cause simultaneous corresponding changes in a length of said laser cavity and a wavelength of said laser output that provide tuning of the laser output wavelength without mode hopping,
wherein the changes in length of said laser cavity and wavelength of said laser output that provide tuning of the laser output wavelength without mode hopping are caused only by the rotation of said etalon structure relative to said laser input.

25. A laser system comprising:
a laser source;
a laser cavity;
an etalon structure for receiving a laser input from said laser source and generating a laser output; and
the etalon structure comprising first and second substrates on which are respectively provided first and second partially transmissive mirrors which are parallel to each other with a space therebetween, wherein
said first substrate has an input surface and said second substrate has an output surface, said input surface and said output surface being substantially parallel to each other and non-parallel to said first and second partially transmissive mirrors, and
said etalon structure and said laser input are rotatable relative to each other to selectively-change an angle of incidence of said laser input on said input surface to cause simultaneous corresponding changes in a length of said laser cavity and a wavelength of said laser output that provide tuning of the laser output wavelength without mode hopping,
wherein the changes in length of said laser cavity and wavelength of said laser output that provide tuning of the laser output wavelength without mode hopping are caused only by said relative rotation.

26. The laser system according to claim 25, further comprising a single actuator that causes said etalon structure to rotate relative to said laser input.

* * * * *